(12) United States Patent
Szajnowski

(10) Patent No.: US 8,499,016 B2
(45) Date of Patent: Jul. 30, 2013

(54) DETERMINATION OF SINE WAVE PERIOD

(75) Inventor: Wieslaw Jerzy Szajnowski, Guildford (GB)

(73) Assignee: Mitsubishi Electric Corporation, Tokyo (JP)

( * ) Notice: Subject to any disclaimer, the term of this patent is extended or adjusted under 35 U.S.C. 154(b) by 684 days.

(21) Appl. No.: 12/663,135

(22) PCT Filed: Jun. 6, 2008

(86) PCT No.: PCT/GB2008/001932
§ 371 (c)(1),
(2), (4) Date: Jun. 7, 2010

(87) PCT Pub. No.: WO2008/149100
PCT Pub. Date: Dec. 11, 2008

(65) Prior Publication Data
US 2010/0293215 A1    Nov. 18, 2010

(30) Foreign Application Priority Data
Jun. 7, 2007 (EP) .................................. 07252302

(51) Int. Cl.
*G06F 17/10* (2006.01)
(52) U.S. Cl.
USPC ........................................................ 708/200
(58) Field of Classification Search
None
See application file for complete search history.

(56) References Cited

U.S. PATENT DOCUMENTS

| 4,328,579 | A | * | 5/1982 | Hashimoto et al. | 370/210 |
|---|---|---|---|---|---|
| 5,321,350 | A | | 6/1994 | Haas | |
| 5,321,401 | A | * | 6/1994 | White | 341/147 |
| 6,356,145 | B1 | * | 3/2002 | Inada | 329/304 |
| 6,646,587 | B2 | | 11/2003 | Funai | |
| 2009/0161736 | A1 | * | 6/2009 | Sullivan | 375/150 |
| 2010/0293215 | A1 | * | 11/2010 | Szajnowski | 708/440 |

FOREIGN PATENT DOCUMENTS

| DE | 2009833 A1 | 9/1970 |
|---|---|---|
| EP | 1777549 A1 | 4/2007 |
| JP | 2000-275333 A | 10/2000 |
| JP | 2004-144696 A | 5/2004 |
| JP | 2004-333269 A | 11/2004 |
| WO | WO 03/044559 A1 | 5/2003 |
| WO | WO 03/044560 A1 | 5/2003 |

\* cited by examiner

*Primary Examiner* — David H Malzahn
(74) *Attorney, Agent, or Firm* — Birch, Stewart, Kolasch & Birch, LLP.

(57) ABSTRACT

An object ranging system operates by transmitting pulses derived from a frequency-swept signal and determining the beat frequency of a combination of the frequency-swept signal and its reflection from an object. To determine the range of close objects the beat frequency is determined in the time domain by integrating samples of the beat frequency signal to obtain a value representing the integral of a half cycle of the sine wave, establishing integration thresholds representing when, according to the integration value, the sine wave would have reached predetermined stages in its cycle, and measuring the time taken for the integral of the sine wave to change from one threshold to another, this time thereby indicating the period of the beat frequency.

14 Claims, 12 Drawing Sheets

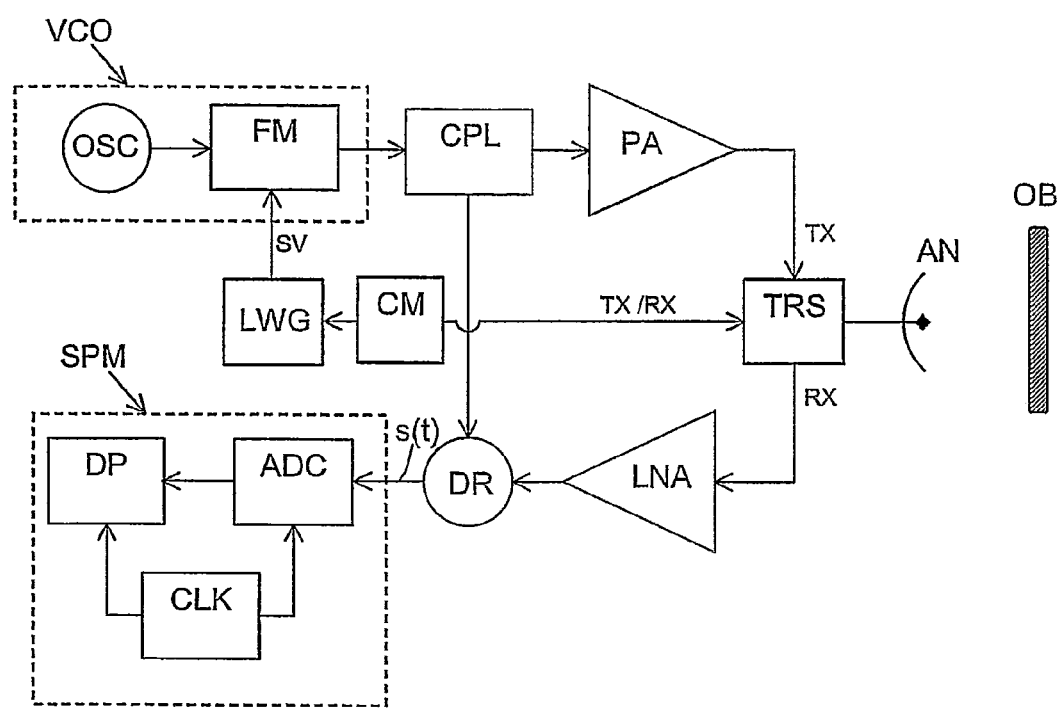
*Prior Art*  *Fig. 1*

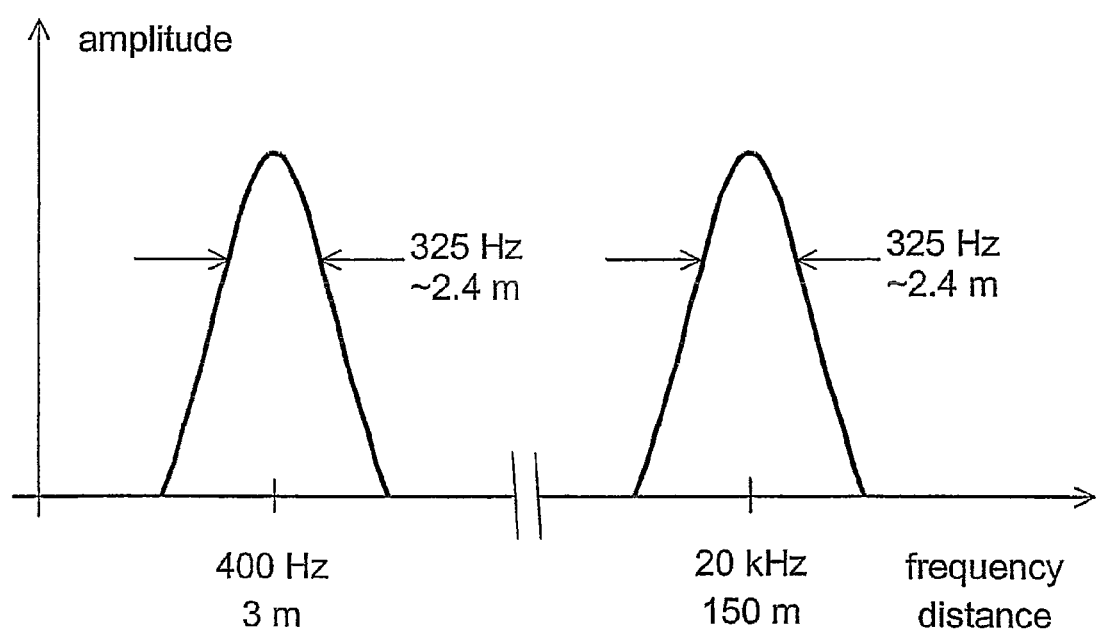
*Prior Art*     *Fig. 4*

DETERMINATION OF SINE WAVE PERIOD

BACKGROUND OF THE INVENTION

1. Field of the Invention

This invention relates to a method for determining the period of a sine wave. The invention is applicable to arrangements in which a sine wave is present in the form of discrete samples, as distinct from a complete continuous wave. The invention is particularly, but not exclusively, applicable to systems for determining the distance to an object using a frequency-modulated carrier combined with pulse transmission such that the distance is determined by the beat frequency derived by combining transmitted and object-reflected signals. Such systems, which may for example have microwave sensors to detect obstacles, could be used as automotive radar systems.

2. Description of the Prior Art

One of many systems, such as those described in WO 03/044559 A1, WO 03/044560 A1, U.S. Pat. No. 6,646,587 B2, JP 2000275333, JP2004333269 and JP2004144696, employed for automotive warning and collision avoidance is frequency modulated interrupted continuous wave (FMICW) radar. In such a system, shown in a block form in FIG. 1, the frequency of a carrier generated by an oscillator OSC is linearly swept in a periodic fashion with a period $T_{SW}$ over a predetermined frequency range $\Delta F$ using a frequency modulator FM in a voltage controlled oscillator VCO. A modulation pattern is provided by a linear waveform generator LWG under the control of a control module CM. The frequency modulated continuous wave (FM-CW) signal is coupled by a coupler CPL to a power amplifier PA where it is amplified, and then gated by means of a transmit-receive switch TRS triggered by the control module CM and operating at a pulse repetition frequency PRI. The transmit-receive switch TRS periodically couples the output of power amplifier PA to an antenna AN for a short interval $\Delta T_T$ to obtain a pulsed RF transmission signal TX directed towards an obstacle OB of interest. During this interval, which is usually a small fraction of a gating period $T_{PRI}=1/PRI$, the switch TRS keeps the radar receiver disconnected from the antenna. The reflected signal RX, delayed by a time $\tau$ proportional to the object distance D, is detected by the same antenna and coupled to a low-noise amplifier LNA via the transmit-receive switch TRS.

The pulse signal reflected from the obstacle is mixed in a downconverter DR with a reference signal formed by a version of the transmitted signal received from the coupler CPL. Because the transmitted and received pulsed signals are mutually delayed, the instantaneous frequencies of the transmitted and received pulsed signal are different. Therefore, the beat signal obtained at the output of downconverter has a differential frequency $F_D$, which is directly proportional to the unknown distance D to the obstacle.

The output of the downconverter DR is delivered to a signal processor module SPM, which comprises an analogue-to-digital converter ADC and a digital processor DP driven by clock pulses from a clock CLK. The converter ADC converts the signal s(t) from the downconverter DR into a digital signal used by the digital processor DP to determine the beat frequency and hence object range.

The modulation pattern provided by the linear waveform generator LWG may follow, for example, a periodical triangular waveform with a constant slope, as shown in FIG. 2a. Employing this particular waveform is often preferred to other linear modulation schemes (such as sawtooth) since it also allows estimation of the velocity of moving obstacles from the Doppler frequency calculated from a pair of differential frequency shifts derived from transmitted and received signals at rising and falling parts of the triangular waveform.

FIG. 2b shows pulsed signals observed at various points of the system of FIG. 1. It can be seen that the operation of switch TRS ensures that the reflected signal is coupled to the radar receiver only during predetermined time slots $\Delta T_R$, which are outside time slots $\Delta T_T$ used for sending the signal from the transmitter. Such a gating scheme minimises strong signals originating from antenna coupling, which can lead to unwanted effects in the receiver such as saturation of the receiver amplifier and/or the analogue-to-digital converter ADC.

In FMICW radar, accurate results are more difficult to obtain with short object distances. Short distances give rise to beat signals having a period $T_D=1/F_D$ which is relatively long. If the distance is sufficiently short, the period is greater than the duration $T_{SW}$ of the frequency sweep. Such a particular case is presented in FIG. 2c. This causes difficulties in estimating the beat frequency, particularly if, as in prior art systems, the envelope, and thus the frequency $F_D$ of the signal, is estimated from the received train of pulses observed during a single frequency sweep of duration $T_{SW}$.

Another limitation of short distance performance of FMICW radar results from the above-described gating scheme performed by the switch TRS. As is shown in FIG. 2b, for time-delays $\tau$ shorter than duration $\Delta T_T$ of transmitted pulses, the duration $\Delta T_{DR}$ (and hence the energy) of the pulses delivered to the downconverter DR is reduced. The shape of such shortened pulses is more likely to be distorted due to, for example, noise and bandwidth limitations in the amplifier LNA and the downconverter DR. As a result, the sampling process performed in the converter ADC at the rate governed by a clock CLK may not correctly determine the amplitude of the pulse. This may lead to errors in estimating the beat frequency from calculations performed in a digital processor DP, and thus a wrong indication regarding obstacle distance.

Further problems associated with short object distances can be seen from the following example.

Assume that an automotive FMICW radar has the following parameters:

duration $T_{SW}$ of a linear frequency sweep, $T_{SW}=4$ ms;
frequency excursion $\Delta F$ during the sweep, $\Delta F=80$ MHz;
pulse repetition interval $T_{PRI}=2$ μs FIG. 2a depicts schematically the relationship between time and frequency, the frequency/time characteristic, for the notional automotive radar under analysis.

Because, in this case, the pulse repetition interval $T_{PRI}$ is equal to 2 μs, the unambiguous range of distance measurement will extend to 300 m. In a radar employing a linear frequency sweep, the distance D to an obstacle is determined from the difference $F_D$ between two frequencies: the frequency of a transmitted signal and that of a signal reflected by the obstacle, where $$F_D = \frac{2D}{c} S_{FT} \qquad (1)$$

where c is the speed of light and $S_{FT}$ is the slope of the frequency/time characteristic, given by $$S_{FT} = \frac{\Delta F}{T_{SW}} = 20 \left[ \frac{\text{Hz}}{\text{ns}} \right] \qquad (2)$$

Therefore, in the considered case, an obstacle at a distance D=3 m will give rise to a differential (beat) frequency $F_D$ of 400 Hz.

If the measurement of beat frequency $F_D$ (hence, distance determination) is to be accomplished using samples acquired within the time interval equal to the duration $T_{SW}$ of a frequency sweep, then the width of the frequency step (bid) of spectral analysis is equal to $1/T_{sw}$=250 Hz. The 3-dB bandwidth and the support of the main lobe are equal to $0.9/T_{sw}$ and $2/T_{sw}$, respectively.

As well known to those skilled in the art, this 3-dB bandwidth will increase when a suitably shaped observation window of duration $T_{se}$, is applied to a received signal to suppress undesired frequency sidelobes. For example, for a Hamming window, the 3-dB bandwidth of the main lobe will be equal to $1.3/T_{SW}$.

FIG. 4 illustrates the effects of finite observation time in the process of frequency and distance determination. As seen, the relative error in distance measurement increases at shorter distances, leading to a significant performance degradation.

From the above it follows that FMICW radar systems exploiting the described signal-processing scheme would suffer from performance loss at short distances. It would therefore be desirable to develop a novel signal-processing method and an apparatus for improving the performance of FMICW radar particularly at short ranges in a more efficient way than provided by prior art techniques, especially in applications for collision avoidance or/and warning systems.

There are two well-known time-domain period/frequency estimators suitable for extracting information from short segments of a sine wave with unknown amplitude A, period T and initial phase θ. The duration of a segment under analysis may be as short as a single period of a sine wave, or even shorter. The two estimators are:
Zero-crossing estimator
Slope/amplitude estimator The principles of these two time-domain estimators are illustrated in FIGS. 5a and 5b, respectively.

In the zero-crossing estimator, the signal s(t)=A sin(2πt/T+θ) is converted, explicitly or implicitly, into a binary representation b(t)=sign[s(t)] so that the times $t_1$ and $t_2$ at which the level of the sine wave successively crosses zero are determined. The unknown period $\hat{T}$ is estimated from the following equation $$\hat{T}_{ZC}=2(t_2-t_1) \quad (3)$$

In the slope-amplitude estimator, the times $t_1$ and $t_2$ are again determined. The rising and falling slopes $S^+$ and $S^-$ of the sine wave at each of these two instants are also determined. The unknown period T is estimated from $$\hat{T}_{SA} = \frac{2\pi A}{|S|} \quad (4)$$

where the amplitude A is estimated as max|s(t)| or $|s[(t_2-t_1)/2]|$, and slope |S| is the average of the slopes $|S^+|$ and $|S^-|$.

However, it would be desirable to have a technique, preferably suited for FMICW radar, which is more efficient, and more accurate, than each of these two conventional time-domain estimators. It would also be desirable to provide a technique which measures a sine wave period using samples of the sine wave and which works well even when the samples are shortened as described above.

SUMMARY OF THE INVENTION

Aspects of the present invention are set out in the accompanying claims.

The invention is preferably embodied as a method or apparatus which may for example be used in an object ranging system which operates by transmitting pulses derived from a frequency-swept signal and determining the beat frequency of a combination of the frequency-swept signal and its reflection from an object. To determine the range of close objects the beat frequency is determined in the time domain by integrating samples of the beat frequency signal to obtain a value representing the integral of a part cycle (e.g. a half cycle) of the sine wave, establishing integration thresholds representing when, according to the integration value, the sine wave would have reached predetermined stages in its cycle, and measuring the time taken for the integral of the sine wave to change from one threshold to another, this time thereby indicating the period of the beat frequency.

The techniques of the present invention are well suited for processing coarsely quantised but highly oversampled data for providing a very accurate measure of frequency.

Preferably, different modes of operation can be selected in an adaptive fashion based on the number of zero- or other level-crossings detected within a segment of the analysed signal.

BRIEF DESCRIPTION OF THE DRAWINGS

Arrangements embodying the present invention will now be described by way of example with reference to the accompanying drawings.

FIG. 1 is a block diagram of a conventional FMICW radar system used for automotive collision avoidance.

FIG. 4 illustrates the effects of finite observation time on frequency and distance determination.

DETAILED DESCRIPTION OF THE PREFERRED EMBODIMENT

Figures 2A, 2B, 2C:
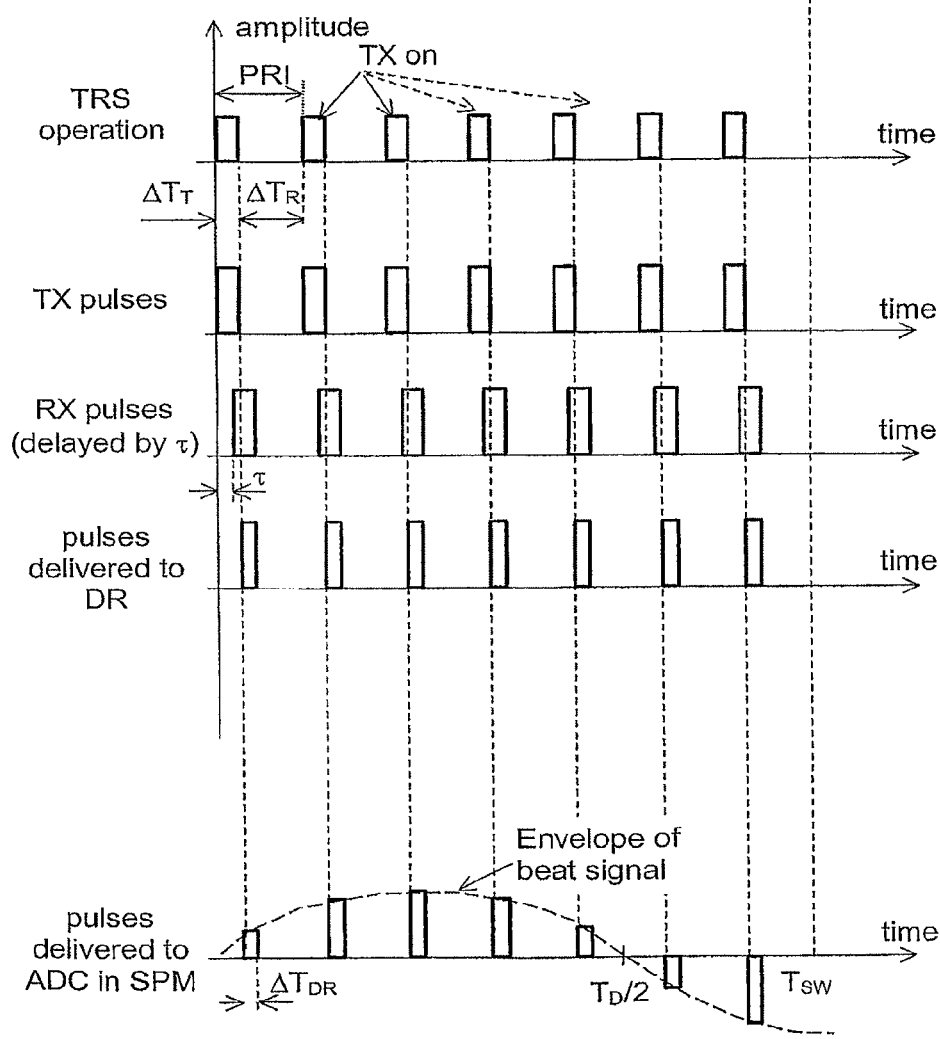
FIG. 2a shows a linear modulation pattern used in the FMICW radar system of FIG. 1.
FIG. 2b illustrates pulsed signals observed at various points of the FMICW radar system of FIG. 1.
FIG. 2c illustrates a process of reconstructing an envelope of the beat signal in order to estimate its frequency.

Referring to FIG. 2c, it will be appreciated that as the beat frequency decreases, although (in conventional systems) the relative ranging accuracy decreases, the number of samples per sine wave period increases. The present invention is able to exploit this phenomenon. The embodiment of the invention described below utilizes all available data of the analysed signal and, being an integral estimator, is capable of providing accurate results by processing coarsely quantised data, especially when oversampling is also employed.

The principles of the embodiment will be explained in detail in the following.

Figure 3:
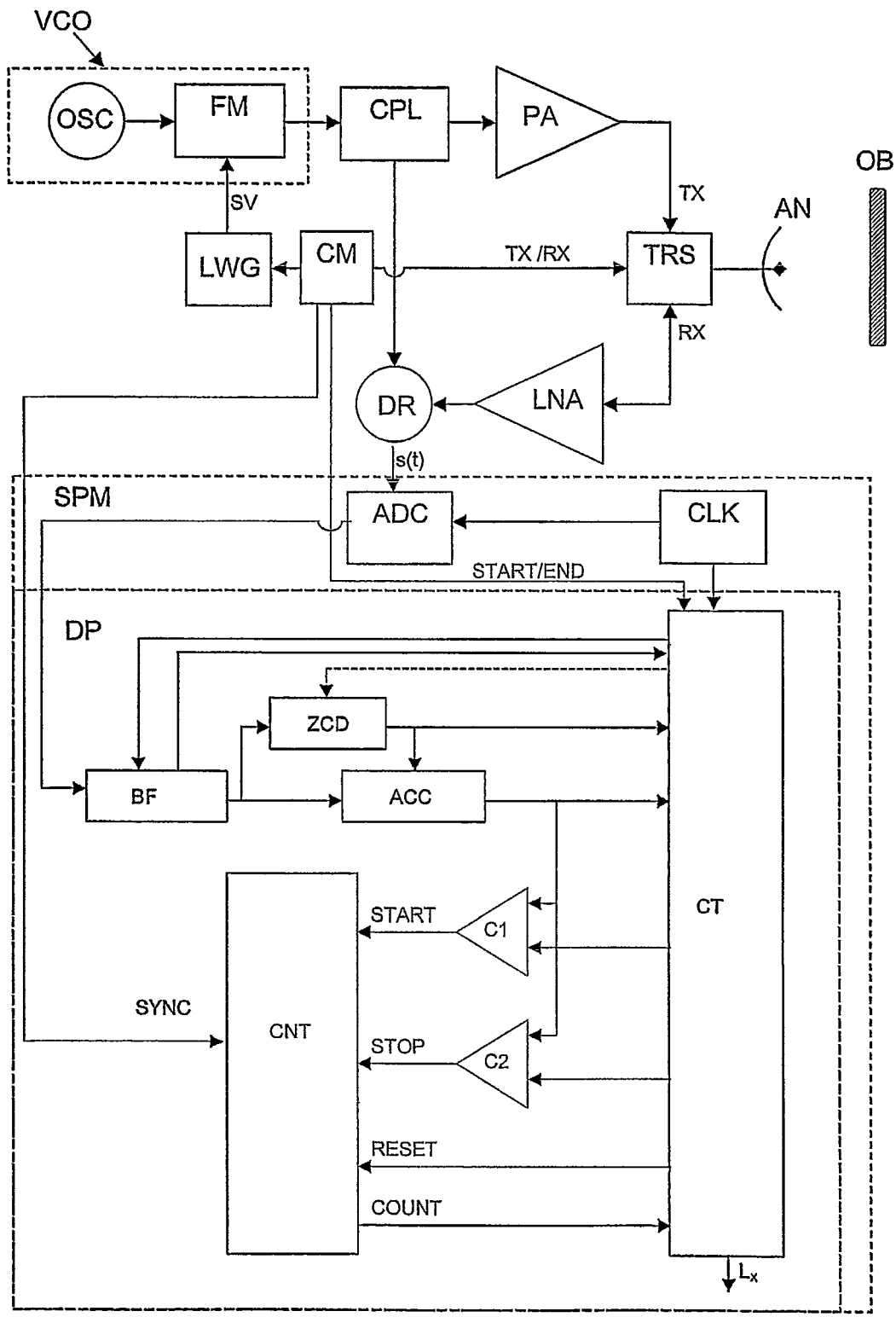
FIG. 3 is a block diagram of a FMICW radar system according to the present invention, used for automotive collision avoidance.
Figure 5A:
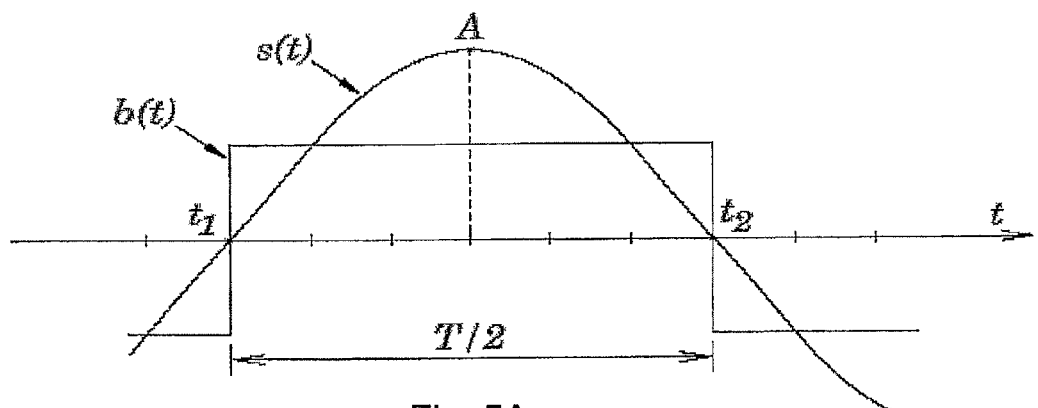
FIG. 5a illustrates the principle of operation of a prior art zero-crossing estimator utilized for estimating the period of a sinusoidal signal from a segment of sub-period duration.
Figure 5B:
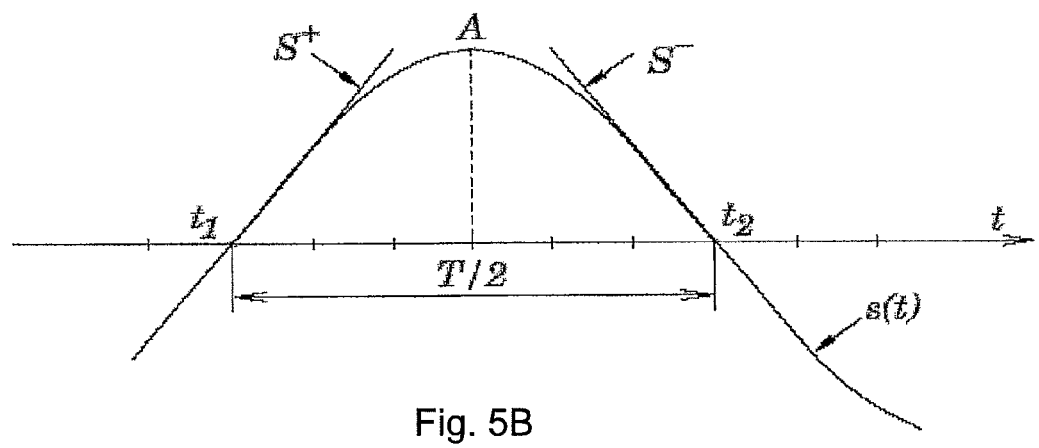
FIG. 5b illustrates the principle of operation of a prior art slope/amplitude estimator utilized for estimating the period of a sinusoidal signal from a segment of sub-period duration.

FIG. 3 is a schematic block diagram of an FMICW radar system according to the invention, the system incorporating a digital processor DP using the techniques of the present invention but otherwise operating as described with reference to FIG. 1. The processor is illustrated in a hardware implementation for purposes of clarity, but can alternatively be implemented as software.

In FIG. 3, the digitised samples of signal s(t) are sent to a buffer BF, from which they can be read out under the control of a controller CT at the same rate as they were received by the buffer. In the present embodiment, the samples are preliminarily processed to remove any dc offset, so they collectively represent samples of at least part of a sine wave having a zero-level average value. The samples received during each observation interval are processed using a two-pass operation. The control module CM periodically generates start/end cycle pulses at the beginning/end of the observation intervals, which pulses are used by the controller CT to synchronise its operation with the observation intervals.

In the first pass, a zero-crossing detector ZCD detects when the sample values cross the zero level for the first time and in response resets an accumulator ACC. The accumulator ACC then starts summing (integrating) the sample values until the next zero-crossing is detected, at which time the controller CT reads the accumulated value stored by the accumulator ACC. This value D is thus a representation of the integral of a half-cycle of the sine wave as represented by the samples. This operation can be repeated for measuring the integration values D for succeeding half-cycles, if sufficient zero-crossings are detected.

The second pass of the operation then commences. The controller CT calculates first and second integration thresholds $I_1$ and $I_2$, each threshold being a respective predetermined proportion of the half-cycle integration value D. The controller applies the thresholds to first inputs of respective comparators C1 and C2, which have second inputs arranged to receive the output of the accumulator ACC. The comparator outputs are connected respectively to start and stop control terminals of a counter CNT, the counter being arranged to count periodic sync pulses which are generated by the control module CM, and which may coincide with time marks used for generating the pulsed RF transmission.

The controller CT applies a reset pulse to the counter CNT and then causes the buffer BF to re-start the outputting of the digitised sine wave samples. The arrangement is such that the comparator C1 starts the counter when the integrated samples reach the first integration threshold I1 and the comparator C2 stops the counter when the integrated samples reach the second integration threshold I2. Accordingly the counter CNT counts up to a value (which is sent to the controller CT) proportional to the time taken for the integrated sample value to change from the first to the second threshold. This value can then be used as described below to calculate the period of the sine wave.

The embodiment can operate in different modes.
First Mode of Operation

The first mode of operation of the embodiment will be described with reference to FIG. 6. It is assumed that at least two zero-crossings are detected in the analysed signal.

Figure 6A:
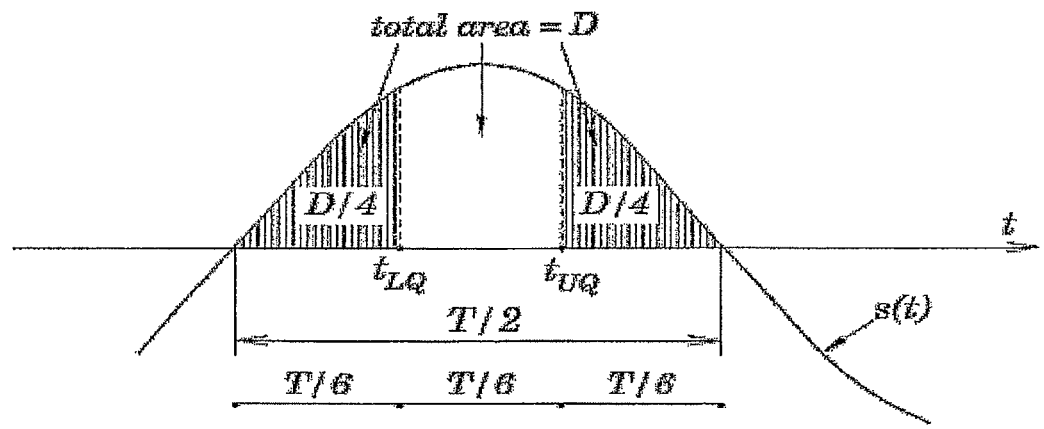
FIG. 6a illustrates the principle of operation of a first mode of the system of FIG. 3.

As explained above, in the first part of the operation, the integration value D, representing the integral of a half-cycle of the sine wave, is calculated (see FIG. 6a). The controller CT then calculates the integration thresholds to be:

$$I_1 = D/4, I_2 = 3D/4$$

Accordingly the counter CNT reaches a count representing the interval between a time $t_{LQ}$ when the integrated value reaches a quarter of the value D and a time $t_{UQ}$ when the integrated value reaches three quarters of the value D.

Assuming the sine wave is represented as (A sin γ) it can be seen from the following that this interval starts and ends when the sine wave reaches π/3 and 2π/3 radians, respectively:

$$\left(\sum_{\gamma=0}^{\pi/3} A\sin\gamma\right) \Big/ \left(\sum_{\gamma=0}^{\pi} A\sin\gamma\right) = \frac{(-\cos(\pi/3) + \cos(0))}{} \Big/ \frac{(-\cos(\pi) + \cos(0))}{}$$
$$= (1/2)/2$$
$$= 1/4$$

$$\left(\sum_{\gamma=0}^{2\pi/3} A\sin\gamma\right) \Big/ \left(\sum_{\gamma=0}^{\pi} A\sin\gamma\right) = \frac{(-\cos(2\pi/3) + \cos(0))}{} \Big/ \frac{(-\cos(\pi) + \cos(0))}{}$$
$$= (3/2)/2$$
$$= 3/4$$

Accordingly, the unknown period $\hat{T}$ is estimated from the following equation:

$$\hat{T} = 6(t_{UQ} - t_{LQ}) \quad (5)$$

A distance estimate $L_x$ can then be derived and outputted by the controller CT, using the known techniques for converting beat frequency to object range.

Figure 6B:
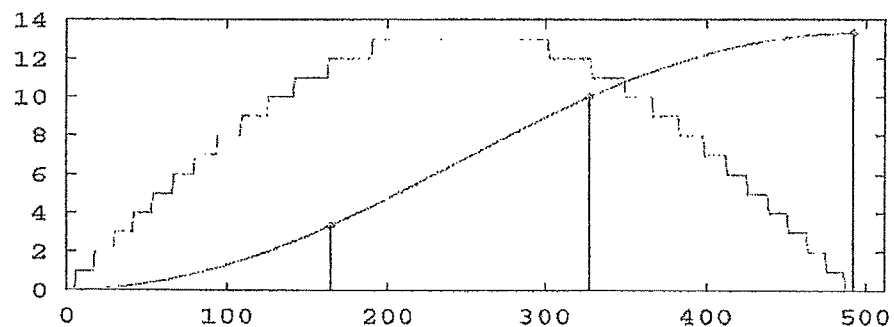
FIGS. 6b and 6c illustrate the effect of coarse quantisation (respectively sign plus 4-bit magnitude and sign plus 3-bit magnitude) on the determination of the unknown period of the sine wave using the first mode.
Figure 6C:
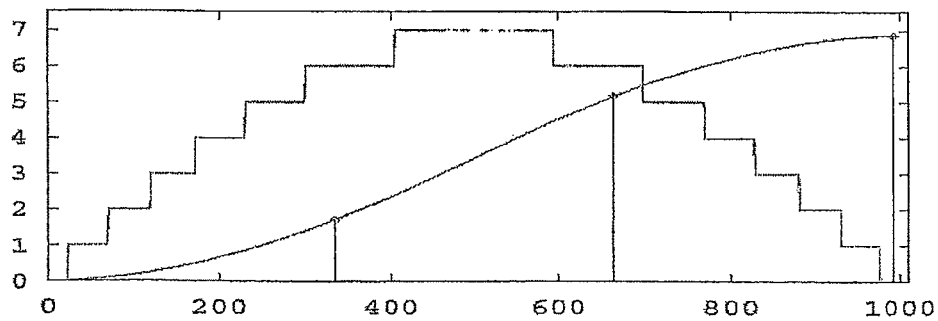

As shown in FIGS. 6b and 6c, although the sine wave may be coarsely quantised, e.g. sign plus 4-bit magnitude, or sign plus 3-bit magnitude, respectively, it is also in the preferred embodiment highly oversampled. Therefore, both the lower and upper quarters, and also the unknown period T of the sine wave, have been determined with a negligible error. In the latter case, the unknown period T of the sine wave can be determined with a small error not exceeding 1%. The technique mitigates the effect of errors in zero crossing detection as compared with the prior art time domain techniques, because the sample values in the region of zero crossings are small and therefore have little influence on the integrated values.

The other modes of operation described below share these advantages.

In the first mode of operation it is assumed that the zero level of the sine wave is known, for example by ensuring that any dc offset is removed, or by using a detection technique such as the one to be described below with reference to FIG. 12. Also, as indicated above, the effect of any errors in estimating the zero level should be mitigated. However, more accurate results can be obtained if steps are taken to compensate for possible errors in the zero level assumed by the zero crossing detector ZCD. The second to fourth modes of operation described below achieve such compensation. In describing these modes, it will be assumed that the zero-crossing detector initially uses an assumed zero level, referred to as a 'virtual zero' level, which is not necessarily the true zero level of the sine wave.

Second Mode of Operation

The second mode of operation will be described with reference to FIG. 7a. It is assumed that only two zero crossings have been detected.

Figure 7A:
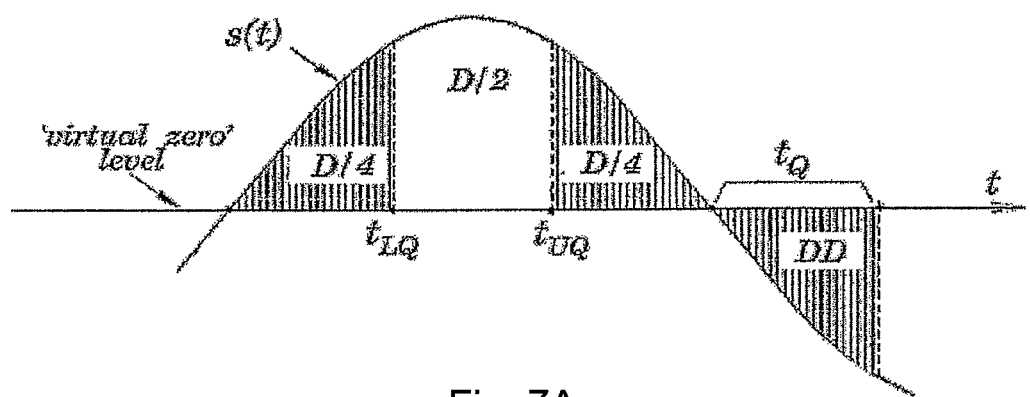
FIGS. 7a and 7b illustrate the principles of operation of second and third modes of the system of FIG. 3.

In the procedure shown in FIG. 7a, anticipated symmetries of the sinusoidal signal are exploited. The procedure corresponds to that of the first mode described above, except as described below. The procedure involves using samples from one half cycle of the sine wave and further samples from another half cycle, one of the half cycles being positive and the other being negative.

The operation involves:

A Determining the integration value D as described above, using provisional amplitude thresholds which have a 'virtual zero' level which may not correspond to the actual sine wave zero level;

B Determining the interval between two predetermined values of the sample integral (e.g. the interval between the times $t_{LQ}$ and $t_{UQ}$ as described above);

C Resetting the accumulator ACC in response to the second zero-crossing, and then reading the output of the accumulator ACC after an interval $t_Q$ which bears a predetermined relationship (e.g. it is equal to) the interval $(t_{UQ}-t_{LQ})$ measured at step B.

The result (DD) of step C is then compared by the controller CT to the previously-obtained integration value D to determine whether a predetermined condition is met, e.g. to determine if either of the following conditions is met:

if DD<D/4—the 'virtual zero' level is too low
if DD>D/4—the 'virtual zero' level is too high Depending on the result, the controller then adjusts the 'virtual zero' level using a control signal delivered along the path shown as a broken line in FIG. 3. The entire operation is then iteratively repeated, by restarting the outputting of samples from the buffer BF, until DD is equal to, or within a predetermined range of, D/4. The calculated period T will then be accurate.

Third Mode of Operation

Figure 7B:
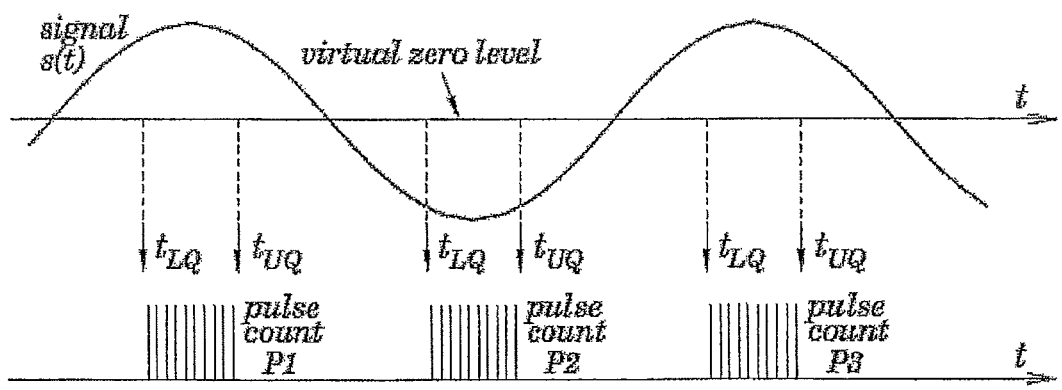

The third mode of operation will be described with reference to FIG. 7b. This mode requires that at least three zero crossings be detected. The third mode of operation corresponds to the first mode, except that the controller CT is operable to repeat the measurement $t_Q = t_{UQ} - t_{LQ}$ for successive half-cycles of the sine wave. The measurements are averaged, preferably by separately averaging the results for the positive and negative half-cycles, so that the final time measurement is formed from the average of the separate positive and negative half-cycle averages. In the case of FIG. 7b, where there are three successive measurements, the average pulse count $\hat{P}$ (which as indicated above represents T/6) is given as follows.

$$\hat{P} = \frac{1}{2}\left(\frac{P1+P3}{2} + P2\right)$$

In this mode, errors in the 'virtual zero' level are automatically compensated because they will cause opposite effects on the positive and negative half-cycle measurements.

Figure 8:
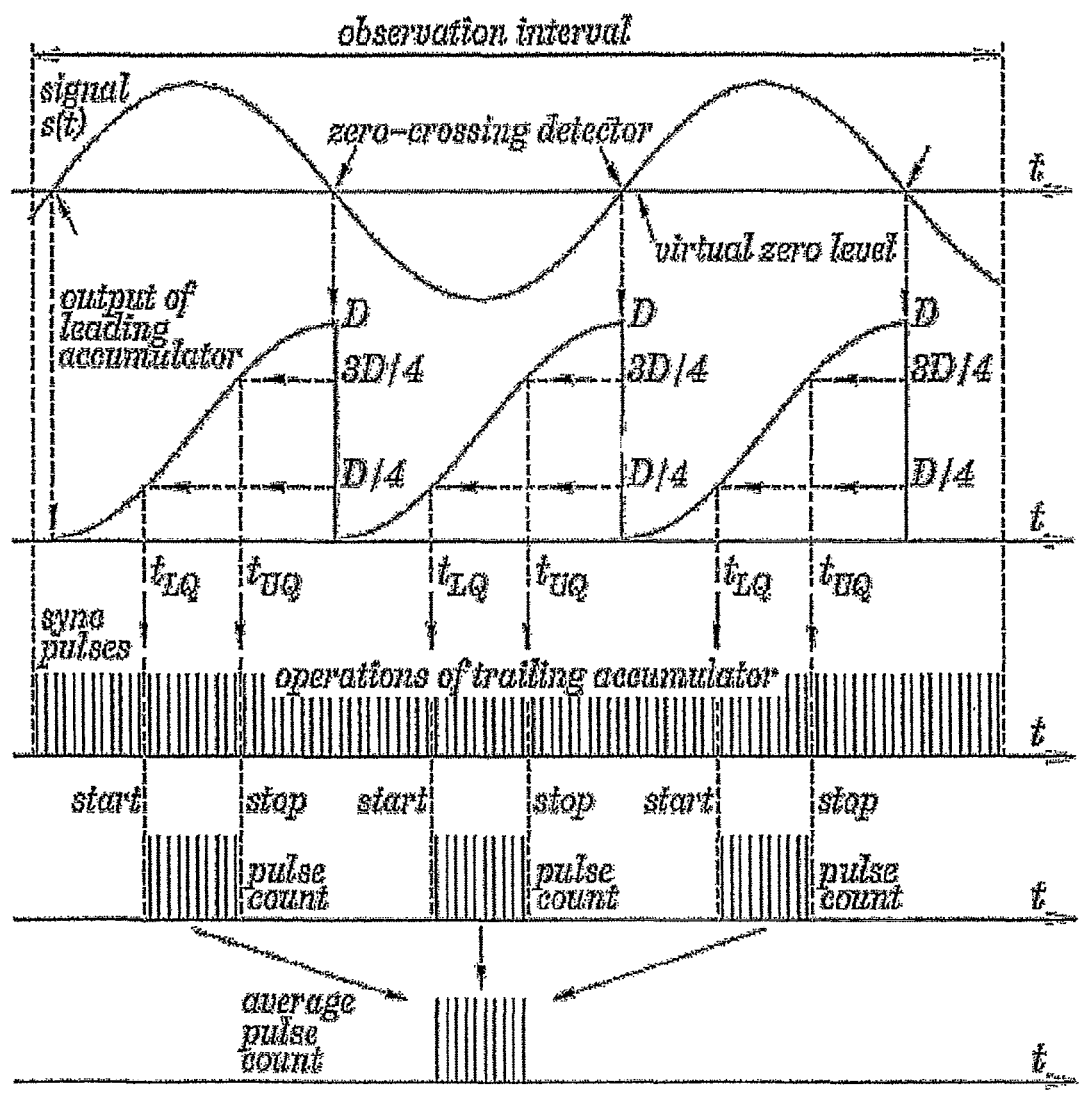
FIG. 8 is a diagram to assist in understanding the third mode of operation.

In a practical application, the range estimation procedure using the third mode follows the process illustrated in FIG. 8. The time estimation is obtained via counting periodic sync pulses generated by the control module CM. The accumulator ACC when operating in the first stage of the process (to determine the integration value D) is referred to as the leading accumulator LA, and when operating in the second stage (to compare its output with the integration thresholds) is referred to as the trailing accumulator TA. At each detected zero-crossing event $t_{ZC}$ a pulse signal is used to reset the leading accumulator LA. The output of the accumulator LA is employed to determine the integration thresholds corresponding to the end of the lower quarter $t_{LQ}$ and the beginning of the upper quarter $t_{UQ}$, and the output of the trailing accumulator TA is monitored to enable counting of sync pulses between the times when those integration thresholds are reached. The counts of sync pulses obtained during each half-cycle of the analysed signal within the whole observation interval are averaged as described above and then used for calculating the unknown period $\hat{T}$ according to equation (5).

The following example demonstrates the potential accuracy enhancement in short-range performance of an automotive FMICW radar when the third mode is used.

Assume that the parameters of the FMICW radar have been so selected as to observe during the sweep $T_S$ exactly one period of the beat frequency $F_D$ for an obstacle at a distance of $L_O$=2 m. If the number of sync pulses generated during $T_S$ is equal to $K_S$=2048, the unknown distance $L_x$ can be estimated from the average sync pulse count $K_P$ as follows $$L_x = \frac{K_S L_O}{6 K_P} \qquad (6)$$
$$= \frac{2048 \times 2}{6 \times K_P} [m]$$
$$\approx \frac{683.7}{K_P} [m]$$

In this example it follows that an error of ±70 sync pulses is equivalent to distance estimation error of ±10 cm.

Fourth Mode of Operation

Figure 9:
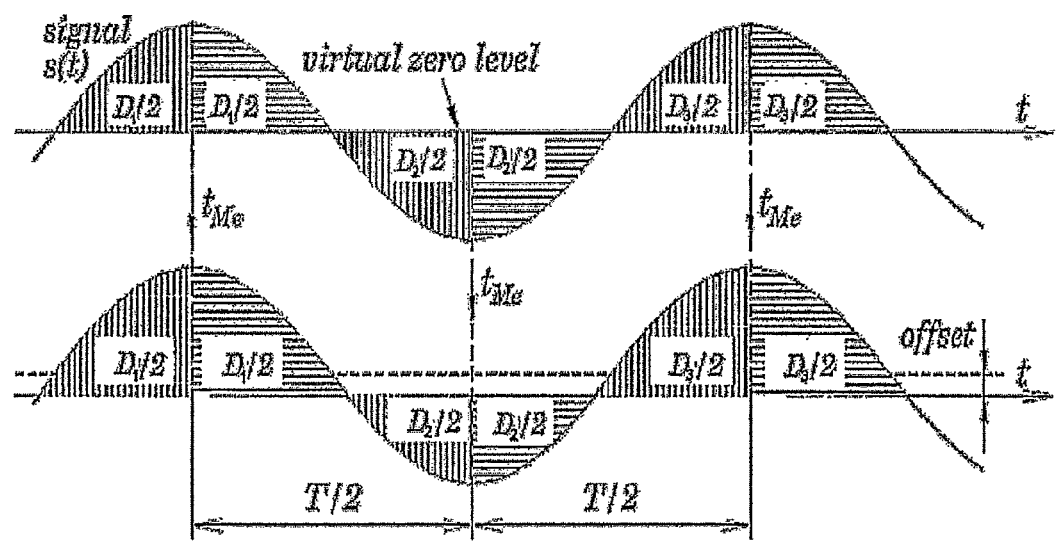
FIG. 9 illustrates the principles of operation of the fourth mode of the system of FIG. 3.

The principle of operation of the fourth mode is described with reference to FIG. 9. This mode can be employed when at least three zero-crossings are detected in the analysed signal.

The operation of this mode is similar to that of the preceding modes except as follows.

During the first stage of operation, as before, the controller obtains an integration value D for each half cycle of the sine wave during the observation window $T_{SW}$. Assume that each integration value equals $D_i$, where i represents the respective half cycle. During the second stage of operation, each integration threshold is set at $D_i/2$, so that the counter CNT successively measures the intervals between the times $t_i$ corresponding to the points at which the integrated sine wave reaches half the respective integration values.

The estimated sine wave period $\hat{T}$ is equal to twice the distance between consecutive times $t_i+1$ and as follows:

$$\hat{T} = 2(t_{i+1} - t_i) \qquad (7)$$

In practice, the period $\hat{T}$ is obtained by averaging all intervals between consecutive times $t_i$. Thus, if there are n+1 half cycles:

$$\hat{T} = 2\sum_{i=1}^{n}(t_{i+1}-t_i)/n \qquad (8)$$

The position of each measured time $t_i$ is independent of zero-level offset. Thus no procedure for correcting an estimated 'virtual-zero' level is required.

Figure 10:
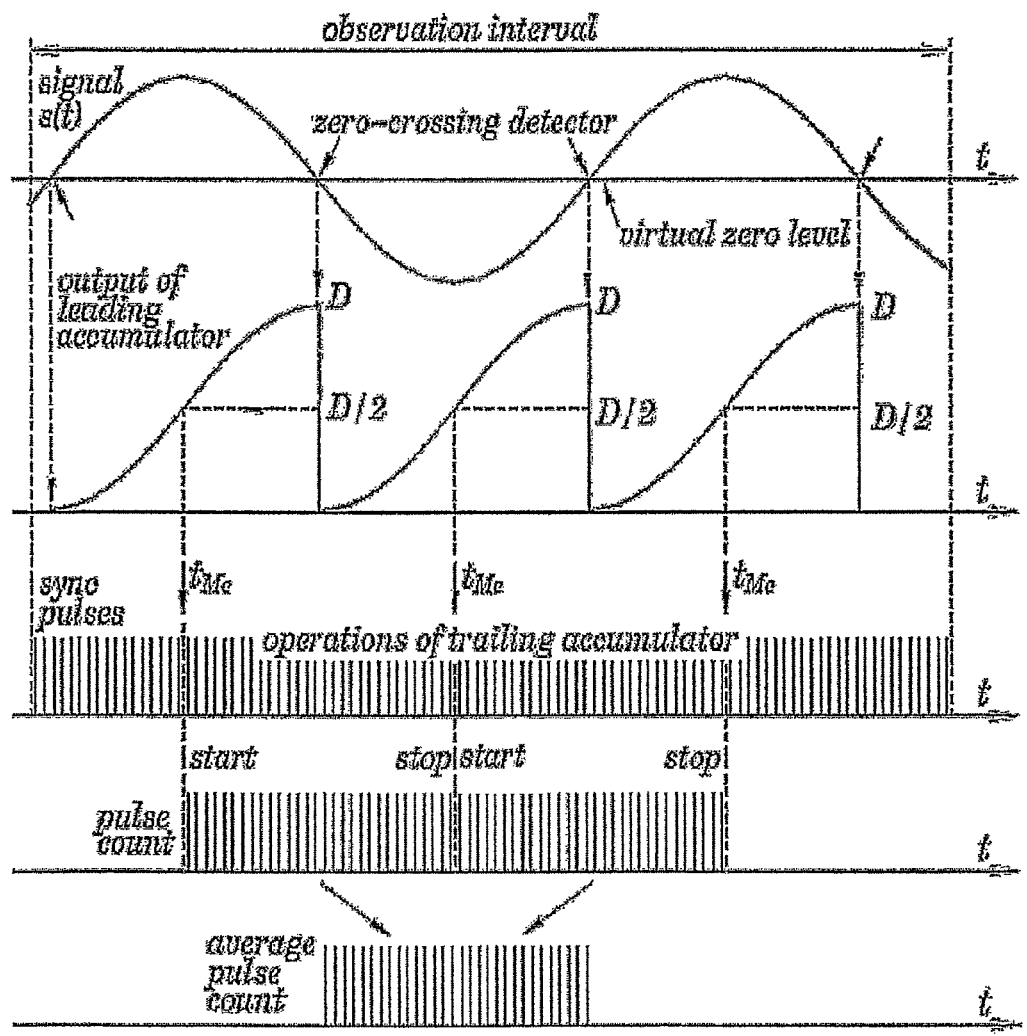
FIG. 10 is a diagram to assist in understanding the fourth mode of operation.

In a practical application, the range estimation procedure using this mode follows the process illustrated in FIG. 10. The time estimation is obtained by counting periodic sync pulses generated by the control module CM. The accumulator ACC when operating in the first stage of the process (to determine the integration values $D_i$) is referred to as the leading accumulator LA, and when operating in the second stage (to compare its output with the integration thresholds $D_i/2$) is referred to as the trailing accumulator TA. At each detected zero-crossing event $t_{ZC}$ a pulse signal is used to reset the leading accumulator LA. The output of the accumulator LA is employed to determine the integration thresholds corresponding to half the integration values $D_i$. The output of the trailing accumulator TA is monitored to enable counting of sync pulses between the times when those integration thresholds are reached. The successive counts of sync pulses obtained within the whole observation interval are averaged as described above and then used for calculating the unknown period $\hat{T}$ according to equation (8).

By way of example, assume that the parameters of the FMICW radar have been so selected as to observe during the sweep $T_S$ exactly one period of the beat frequency $F_D$ for an obstacle at a distance of $L_O=2$ m. Because the number of pulses transmitted during $T_S$ is equal to $K_S=2048$, the unknown distance $L_x$ can be estimated from the average pulse count $K_p$ as follows $$L_x = \frac{K_S L_O}{2K_P}$$
$$= \frac{2048 \times 2}{2 \times K_P}[m]$$
$$= \frac{2048}{K_P}[m]$$

Because the fourth mode is not sensitive to a shift of the 'virtual-zero' level, no offset compensation is needed to achieve correct estimation of the measured distance.

The fourth mode could be modified by omitting the processing of the positive (or negative) half cycles, and thus simply measuring the interval between successive positive (or negative) peaks.

Fifth Mode of Operation

In the operation modes described above, samples are integrated between zero-crossings. According to the fifth mode, samples are integrated between a zero-crossing and an adjacent signal extremum, which may be a preceding or following maximum or minimum.

Figure 11:
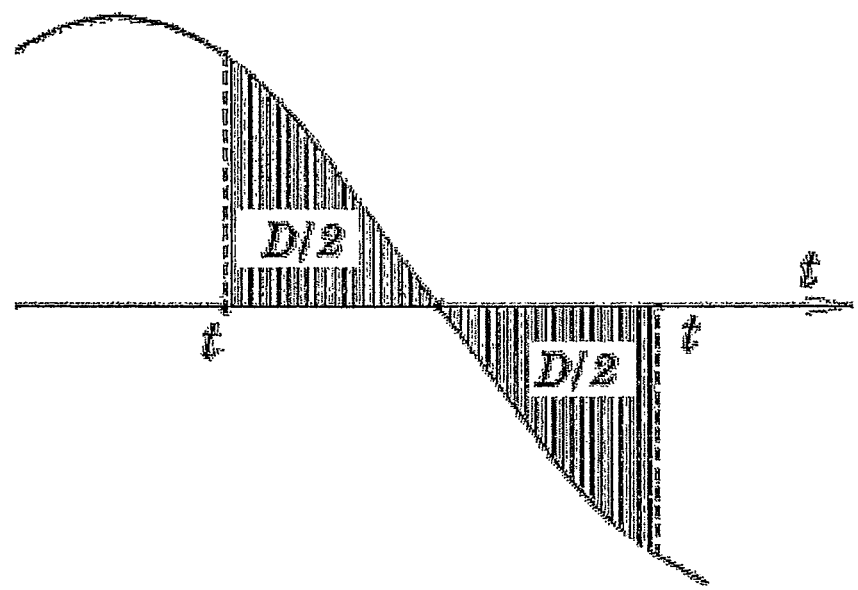
FIG. 11 illustrates the principles of operation of the fifth mode of the system of FIG. 3.

Thus, referring to FIG. 11, in this example a maximum value M is detected, followed by a zero crossing Z. The samples between these events are integrated to derive an integration value D. From this there are derived first and second integration threshold values, each equal to D/2. The samples from the buffer BF are outputted, starting at the zero-crossing Z and proceeding in the reverse order to the received sequence until the integral of the absolute values of the samples equals the first threshold D/2. This determines a first time point $t_1$. Then, the samples from the buffer BF are outputted, starting at the zero-crossing Z and proceeding forwards (i.e. in the same order as the received sequence) until the integral of the absolute values of the samples equals the second threshold D/2. This determines a second time point $t_2$. The unknown sine wave period is then derived from:

$$\hat{T}=3|(t_2-t_1)|$$

It will be understood that the fifth mode can derive the period from samples containing only one zero-crossing and possibly occupying less than a half cycle of the sine wave.

Sixth Mode of Operation

The sixth mode is similar to the fifth, except that samples are integrated between a single zero-crossing and both a preceding and a following signal extremum.

Figure 12:
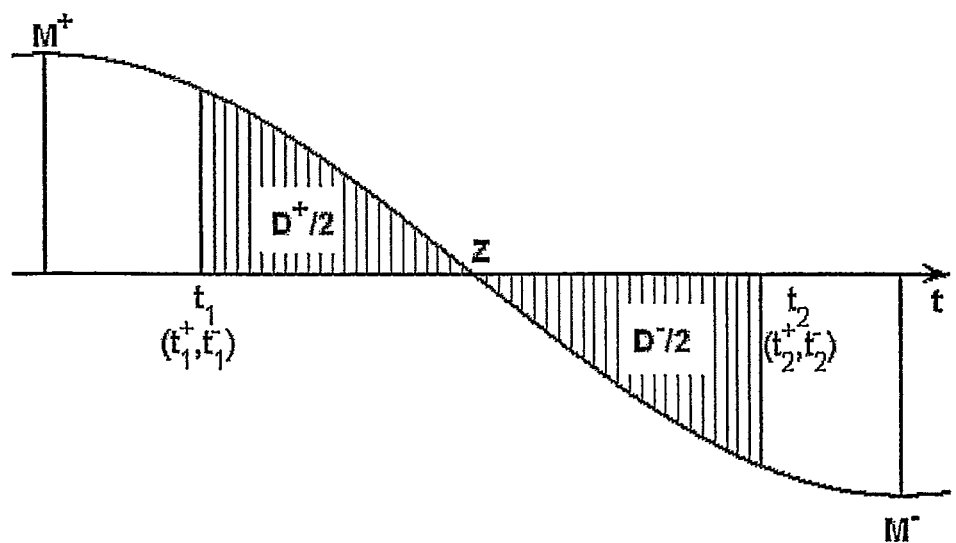
FIG. 12 illustrates the principles of operation of the sixth mode of the system of FIG. 3.

Thus, referring to FIG. 12, in this example a maximum value $M^+$ is detected, followed by a zero crossing Z and then a minimum value $M^-$.

In a first embodiment of the sixth mode, the samples between the maximum $M^+$ and the zero-crossing Z are integrated to derive an integration value $D^+$. From this there is derived a first integration threshold value $D^+/2$. The samples from the buffer BF are outputted, starting at the zero-crossing Z and proceeding in the reverse order to the received sequence until the integral of the absolute values of the samples equals the first threshold $D^+/2$. This determines a first time point $t_1$. The samples between the zero-crossing Z and the minimum $M^-$ and are integrated to derive an integration value $D^-$. From this there is derived a second integration threshold value $D^-/2$. Then, the samples from the buffer BF are outputted, starting at the zero-crossing Z and proceeding forwards (i.e. in the same order as the received sequence) until the integral of the absolute values of the samples equals the second threshold $D^-/2$. This determines a second time point $t_2$.

In a second, alternative embodiment of the sixth mode, the first integration threshold $D^+/2$ is used to determine values $t_1^+$ and $t_2^+$ by integrating both forwards and backwards from the zero-crossing Z. Also, the second integration threshold D72 is used to determine values $t_1^-$ and $t_2^-$ by integrating both forwards and backwards from the zero-crossing Z. The final values $t_1$ and $t_2$ are obtained by suitable combining (e.g. averaging) respectively the two values $t_1^+$ and $t_1^-$, and the two values $t_2^+$ and $t_2^-$.

The unknown sine wave period is then derived from:

$$\hat{T}=3|(t_2-t_1)|$$

Figure 13:
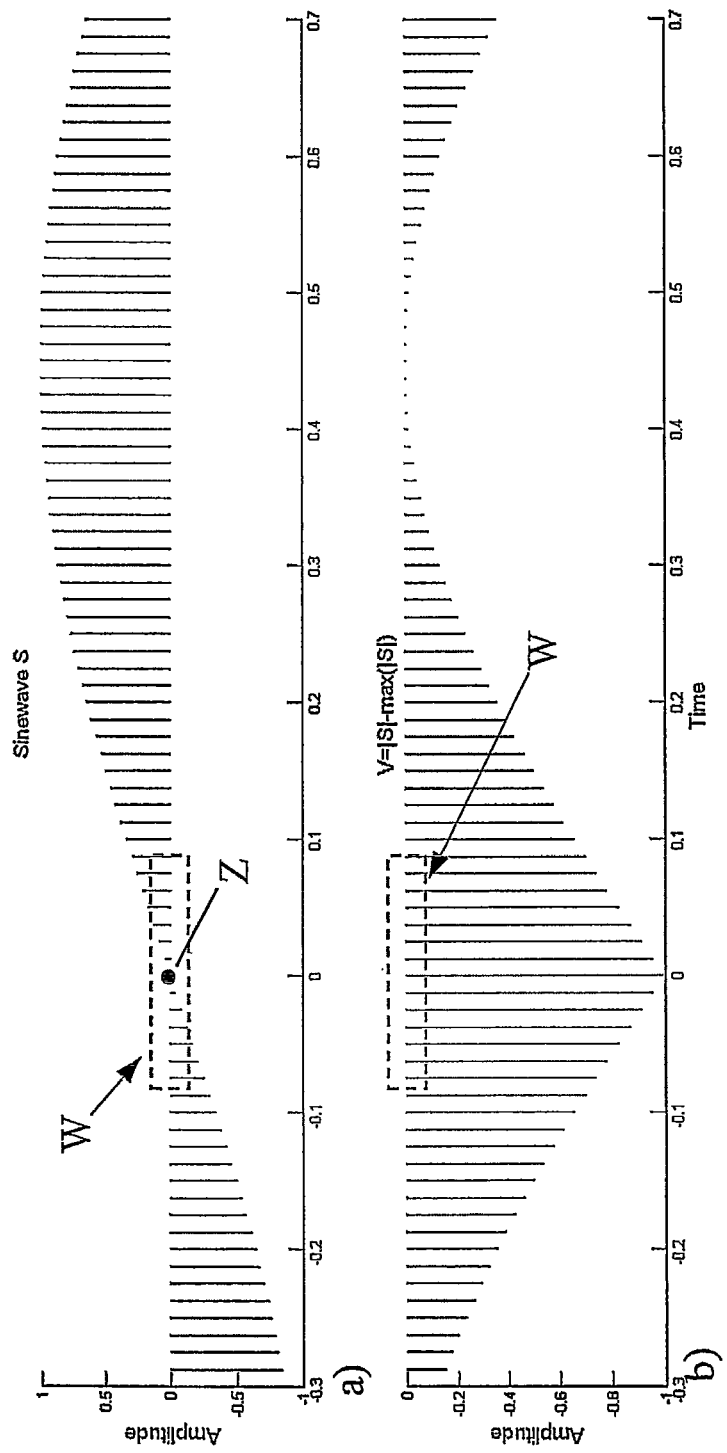
FIGS. 13a and 13b diagrammatically illustrate techniques for detecting zero-crossings and extrema of a sinusoidal signal which has maximum and minimum values of +1 and −1 units, respectively, the diagrams having horizontal time axes in arbitrary units.

Preferred techniques for detecting the zero-crossing and the extremum in the fifth and sixth modes will be described with reference to FIG. 13. These techniques may be performed by the controller CT by examining the samples stored in the buffer BF, from which it can receive the sample values directly as indicated in FIG. 3. To perform the techniques, the controller CT uses a sliding window which operates on a group of a predetermined number of successive samples, and then is repeatedly shifted by one sample to repeat the operation.

Referring to FIG. 13a, this schematically shows the sliding window W in the vicinity of a zero-crossing Z. To detect the zero-crossing, the controller CT first positions the sample window at the beginning of the buffer BF and then:
(i) derives a first value C1 which is the absolute value of $(N^+-N^-)$, where $N^+$ is the number of positive sample values and $N^-$ is the number of negative sample values, and
(ii) derives a second value C2 which is equal to $(N^++N)$.

If C1 is less than or equal to a first predetermined number, e.g. 1, and C2 is equal to or greater than a second predetermined number, e.g. 2, then the controller CT determines that a zero-crossing is present at the centre of the window. The C1 condition represents that the number of negative samples is substantially equal to the number of positive sample values. The C2 condition means that a predetermined number of non-zero values have been detected and thus avoids false indications resulting from long sequences of zero values.

The sliding window W is then moved along by one sample, and the tests are repeated. This continues until the window arrives at the end of the buffer. As indicated below, the arrangement may be such that the fifth mode of operation is used only if exactly one zero-crossing is detected.

In order to detect an extremum, the sample values are transformed by the controller CT, using the formula:

$$V=|S|-\max(|S|)$$

where S is a sample value, and V is the transformed sample value. Thus, determining the location of either a maximum or a minimum of the sine wave is equivalent to detecting a maximum of the transformed data.

Thus, to detect an extremum, the controller CT determines max(|S|), i.e. the largest absolute sample value in the buffer BF, and then determines the remaining transformed sample values. Then the controller CT positions the sample window at the beginning of a sequence of transformed values V as schematically represented in FIG. 13b, and then:
(i) derives a first value C3 which is given by (the sum of the transformed values in the left (first) half of the sample window) minus (the sum of the transformed values in the right (second) half of the sample window). (If desired, the resultant quantity can be divided by the sum of all values in the buffer, to normalise the value C3.)
(ii) derives a second value C4 which, like C2, is equal to $(N^{+}+N^{-})$, where $N^{+}$ is the number of positive sample values S and $N^{-}$ is the number of negative sample values S.
(iii) derives a third value C5 which indicates whether or not a zero transformed value V (or a small value, e.g. lower than the difference between quantisation levels) is present in the window (or alternatively indicates whether such a value V is present at or near the centre of the window).

If C3 is less than or equal to a third predetermined number, and C4 is equal to or greater than a fourth predetermined number, and C5 indicates that a zero value (or small value e.g. lower than difference between quantisation levels) is present in the window, then the controller CT determines that an extremum is present at the centre of the window. The C3 condition represents that the sample values are substantially symmetrical about the centre of the window. The C4 condition means that a predetermined number of non-zero values have been detected and thus avoids false indications resulting from long sequences of zero values. The C5 condition distinguishes from false indications resulting from other parts of the transformed signal (e.g. zero-crossings) which are symmetric about the centre of the window but which are not extrema.

The sliding window W is then moved along by one sample, and the tests are repeated. This continues until the window arrives at the end of the sequence. The operation may be arranged to stop as soon as the first extremum is found.

If desired, the technique of FIG. 13a and/or the technique of FIG. 13b may be used in other modes of operation employing more than one zero-crossing and/or extrema.

The buffer BF used in the above-described embodiment enables processing of the samples in various sequences, not necessarily corresponding to the order of the operations described above. This has several advantages. For example, FIG. 7a shows the integration of samples which follow the second zero crossing to obtain the value DD. However, by appropriately processing the samples in the buffer, it would be possible instead to integrate the samples which occur in the period $t_O$ preceding the first zero crossing.

The samples can be read out of the buffer at any predetermined rate, so that they can if desired be processed faster than they are written into the buffer.

If desired, the counter CNT can be arranged to count fixed frequency clock pulses, rather than the sync pulses from control module CM.

A modified embodiment uses multiple buffers to enable the processing of samples from successive observation intervals in parallel.

If desired the object range can be calculated from samples received in multiple observation intervals, rather than just a single observation interval.

In the above embodiment, each integration threshold is applied to samples from the same part of the sine wave used to derive the integration value D from which the threshold is calculated. This arrangement, which uses a delay device such as the buffer BF, is preferred to reduce the effects of noise, but is not essential. The threshold could instead, for example, be used for samples of a succeeding half-cycle.

Mode Selection

In an automotive FMICW radar system, time-based algorithm methods such as those described above may operate along with one or more other techniques, such as a standard FFT-based algorithm, which can provide correct range estimate for longer ranges. For example, the standard mode may be employed for exploratory purposes to scan the full range and register potential obstacles, whereas a reduced-range (zooming) operation using one of the modes described above may be used to examine obstacles located closer to the radar. Instead of or as well as, using a standard mode, the system could use the techniques of EP 05256585.0, filed 24 Oct. 2005, incorporated herein by reference.

Preferably, the controller CT is operable to select the mode of operation according to the number N of zero crossings detected within the observation interval. For example, the controller may select the mode according to the following table, in which X is a predetermined number (e.g. 10), and condition K indicates that there is sufficient time within the observation interval, either before the first zero crossing or after the last zero-crossing, to perform the necessary integration both before and after the zero-crossing (see FIGS. 7a and 11).

| Number N of zero-crossings | Mode of operation |
| --- | --- |
| N > X | Long range mode (e.g. standard techniques, or techniques of EP 05256585.0) |
| X ≧ N < 4 | Fourth mode |
| 4 ≧ N ≦ 3 | Third mode |
| N = 2 and K = True | Second mode |
| N = 2 and K = False | First mode |
| N = 1 and K = True, and 1 extremum detected | Fifth mode |
| N = 1 and 2 extrema detected | Sixth mode |

Various modifications are possible. For example, the second mode described above involves a procedure for determining the zero level of the sine wave, whereas the third and fourth modes give results which should be insensitive to zero level errors. Nevertheless, the third and fourth modes could be modified to use a level correcting procedure corresponding to that of the second mode. Removal of dc offset from the signal s(t) can be achieved in either the analogue or digital domain using any known technique, or can be omitted if it is desired to rely on the offset-compensating techniques of, for example, the second mode.

The foregoing description of preferred embodiments of the invention has been presented for the purpose of illustration and description. It is not intended to be exhaustive or to limit the invention to the precise form disclosed. In light of the foregoing description, it is evident that many alterations, modifications, and variations will enable those skilled in the art to utilize the invention in various embodiments suited to the particular use contemplated.

The invention claimed is:

1. A method of determining the period of a sine wave from samples thereof, the method comprising:
   calculating, using a processor including a memory, at least first and second integration thresholds, each threshold being calculated by integrating the samples during an interval between times at which the sine wave adopts first and second amplitude threshold levels to obtain an integration value and calculating a predetermined proportion of that integration value; and
   determining, using a processor including a memory, the time taken for the integral of the samples to change from a first integration threshold level to a second integration threshold level, said time being proportional to the sine wave period.

2. A method as claimed in claim 1, wherein at least one of the first and second amplitude threshold levels used to obtain said integration value is substantially equal to the zero level of the sine wave.

3. A method as claimed in claim 2, wherein both of the first and second amplitude threshold levels used to obtain said integration value are substantially equal to the zero level of the sine wave.

4. A method as claimed in claim 2, wherein the other of said first and second amplitude threshold levels used to obtain said integration value is an extreme value of the sine wave.

5. A method as claimed in claim 1, wherein the first and second integration threshold levels are each calculated to be respective predetermined proportions of the same integration value.

6. A method as claimed in claim 5, wherein the first and second integration threshold levels are, respectively, one quarter and three quarters of said same integration value.

7. A method as claimed in claim 5, wherein the step of determining the time taken for the integral of the samples to change from the first integration threshold level to the second integration threshold level is repeated for successive half cycles of the sine wave, the results being averaged to determine the period.

8. A method as claimed in claim 7, wherein the results for the positive and negative half cycles are separately averaged, and the two averages are averaged to determine the period.

9. A method as claimed in claim 1, further comprising the step of:
   calculating, using a processor including a memory, the amplitude threshold levels to correspond to the zero level of the sine wave using samples of a positive half cycle and a negative half cycle of the sine wave, the amplitude threshold levels being calculated to meet the condition that a first value (D), obtained by integrating the samples during one of said half cycles, bears a predetermined relationship with a second value (DD), obtained by integrating the samples during the other of said half cycles, wherein the second value (DD) is obtained by integrating over a duration ($t_Q$) which bears a predetermined relationship to the duration ($t_{UQ}-t_{LQ}$) taken for the integral of the samples during said one half cycle to change from first (D/4) to second (3D/4) predetermined values related in a predetermined manner to the first value (D).

10. A method as claimed in claim 1, wherein the first and second integration threshold levels are equal to one half of respective integration values, each integration value being obtained by integration of samples during a respective half cycle of the sine wave.

11. A method as claimed claim 1, wherein said time-determining step comprises determining the time taken for the integral of samples within said interval to change from the first integration threshold level to the second integration threshold level.

12. A method of determining the distance to an object, the method comprising:
   generating, using a processor including a memory, a primary, frequency-modulated signal;
   deriving, using a processor including a memory, from the primary signal a reference signal and an interrogation signal, the interrogation signal comprising discrete pulses at different frequencies;
   transmitting, using a processor including a memory, the interrogation signal;
   obtaining, using a processor including a memory, a received signal comprising a reflection of the interrogation signal from an object;
   combining, using a processor including a memory, the reference signal with the received signal to derive a samples of a sine wave having a beat frequency indicative of the range of the object; and
   determining, using a processor including a memory, the period of the sine wave using a method as claimed in claim 1.

13. An apparatus for determining the period of a sine wave from samples thereof, the apparatus comprising:
   means for calculating at least first and second integration thresholds, each threshold being calculated by integrating samples during an interval between times at which the sine wave adopts first and second amplitude threshold levels to obtain an integration value and calculating a predetermined proportion of that integration value; and
   means for determining the time taken for the integral of the samples to change from a first integration threshold level to a second integration threshold level, said time being proportional to the sine wave period.

14. Apparatus as claimed in claim 13, including means for selecting different modes of operation in dependence on the number of times the sine wave traverses an amplitude threshold, each said mode using a different algorithm for calculating the sine wave period.

* * * * *